United States Patent [19]

Kreider

[11] Patent Number: 5,251,981
[45] Date of Patent: Oct. 12, 1993

[54] CORROSION RESISTANT THIN FILM THERMOCOUPLES AND METHOD

[75] Inventor: Kenneth G. Kreider, Potomac, Md.

[73] Assignee: United States of America, as Represented by the Secretary of Commerce, Washington, D.C.

[21] Appl. No.: 874,684

[22] Filed: Apr. 28, 1992

[51] Int. Cl.$^5$ .................. G01K 7/02; H01L 35/12
[52] U.S. Cl. .................. 374/179; 136/236.1; 136/238; 136/225
[58] Field of Search ............. 374/179, 180, 181, 182, 374/163; 136/236.1, 238, 225, 227

[56] References Cited

U.S. PATENT DOCUMENTS

| | | | |
|---|---|---|---|
| 2,912,477 | 11/1959 | Fischer et al. | 136/236.1 |
| 2,981,775 | 4/1961 | Bachman | 136/236.1 |
| 4,029,472 | 6/1977 | Micheli et al. | 136/236.1 |
| 4,110,124 | 8/1978 | Robertson et al. | 374/179 |
| 4,332,081 | 6/1982 | Francis | 374/185 |
| 4,717,786 | 1/1988 | Thery et al. | 374/179 |
| 4,795,498 | 1/1989 | Germanton et al. | 374/179 |
| 4,969,956 | 11/1990 | Kreider et al. | 136/225 |
| 5,167,723 | 12/1992 | Tsukakoshi | 136/225 |

FOREIGN PATENT DOCUMENTS 57-94622 6/1982 Japan .................... 374/179

OTHER PUBLICATIONS

Lauks et al., "Electrically Fee-Standing IrO$_x$, Thin Film Electrodes for High Temperature, Corrosive Environment pH Sensing", *Sensors and Actuators* 4 (1983), p. 375.

Burgess et al., "Transient Thermal Response of Plasma-Sprayed Zirconia Measured with Thin-Film Thermocouples", *Sensors and Actuators*, A,24, (1990), pp. 155–161.

Kreider "IrO$_2$ Radio Frequency Sputtered Thin Film Properties", *J. Vac. Sci. Technol*, A, 40, (1985) p. 606.

Kotz et al., "Stabilization of RuO$_2$ by IrO$_2$ for Anodic Oxygen Evolution in Acid Media", Brown Boveri Research Center CH-5405 Baden/Switzerland, pp. 1–21.

Horkins et al., "An Investigation of the Electrochemistry of a Series of Metal Dioxides with Rutile-Type Structure: MoO$_2$, WO$_2$, ReO$_2$, RuO$_2$, OsO$_2$ and IrO$_2$", *Journal Electrochemical Society*, vol. 124, No. 8, (1977), p. 1202.

Primary Examiner—William A. Cuchlinski, Jr.
Assistant Examiner—G. Bradley Bennett
Attorney, Agent, or Firm—James A. Poulos, III

[57] ABSTRACT

The invention relates to thermocouples which are formed from a junction of ruthenium oxide (RuO$_2$) and iridium oxide (IrO$_2$). The resulting thermocouple produces a typical electrical output of about 4.5 μV/k at 40° C. to about 4.1 μv/K at 200° C. The thermocouples are extremely resistant to corrosion and thus may be used for direct contact with corrosive environments such as halide containing acids, cyanides, chlorates or peroxides. Because the thermocouples can directly contact the environment, they are 100 to 1000 times faster than commercially available sheathed sensors.

15 Claims, 1 Drawing Sheet

CORROSION RESISTANT THIN FILM THERMOCOUPLES AND METHOD

BACKGROUND OF THE INVENTION

1. Field of the Invention

This invention relates to new devices used for temperature measurement, especially in corrosive environments, and to a method of use of the same. Preferred embodiments of the devices include improved, fast response, measuring devices for indicating temperature in corrosive chemical process streams.

2. Background of the Invention

It has long been desired to provide methods and devices for determining temperatures in corrosive environments. However, due to the hostile nature of such environments, the use of conventional temperature measuring devices has not proved to be satisfactory.

The measurement of temperature in corrosive, hostile environments has been accomplished to date using protective sheaths or thermowells. This protective enclosure can be designed to protect the temperature sensing elements from almost any corrosive environment, however, a serious compromise attends the use of the sheath leading to slow response. Commercial temperature sensors for corrosive environments have response time greater than one second. In many chemical processes this response speed is not adequate.

The invention described below relates to fabricating the temperature sensor from materials which are among the most corrosive resistant materials available: ruthenium oxide and iridium oxide. Their outstanding corrosion resistance has led to their use in geothermal brines at temperatures above 100° C., See generally, "Electrically Free-Standing IrO$_x$ Thin Film Electrodes For High Temperature, Corrosive Environment pH Sensing", I. Lauks, M. F. Yuen and T. Dietz, *Sensors and Actuators*, 4 (1983), p. 375, and as charge injection electrodes, see "Stabilization of RuO$_2$ by IrO$_2$ For Anodic Oxygen Evolution", R. Kötz and S. Stucki, *Acid Media*, Brown Boveri Research Center, CH-5405, Baden, Switzerland, the entire disclosures of which are herein incorporated by reference.

In addition, by fabricating these temperature sensing electrodes as thin films their response can be in the microsecond range. The response characteristics of thin film thermocouples has been determined separately and reported by D. Burgess, Jr., M. Yust and K. G. Kreider, "Transient Thermal Response of Plasma-Sprayed Zirconia Measured with Thin-Film Thermocouple", *Sensors and Actuators*, A24 (1990), pp. 155–161, the entire disclosure of which is herein incorporated by reference.

OBJECTS OF THE INVENTION

It is an object of the invention to provide temperature measuring devices which avoid the aforementioned and other drawbacks of the prior art.

It is a further object of the invention to provide methods of measuring temperatures of corrosive environments with measuring devices which provide fast response temperature measurements, especially in corrosive fluids.

These and other objects of the invention will become apparent from the following description of the invention.

SUMMARY OF THE INVENTION

In contrast to the commercially available temperature sensors, which include sheathed thermocouples as the most prevalent types, the present invention provides a fast response (up to 1 μsec depending on the substrate) solid state corrosion resistant junction employing ruthenium oxide and iridium oxide.

The thermocouple of the invention has been fabricated by magnetron sputtering in a manner similar to that reported by K. Kreider in a publication entitled "Summary Abstract: IrO$_2$ radio frequency sputtered thin film properties", J. Vac. S. T. A4(3) (1986), pp. 606–607, the entire disclosure of which is herein incorporated by reference. The electric and thermoelectric properties of the sputtered thin films have been found to be sensitive to the fabrication procedures employed to form the sputtered thin film oxides. The properties of the thin films are related to the microstructure, stoichiometry and crystal structure, as determined by scanning electron microscopy and x-ray diffraction. Heat treatments of the sputtered films have been found effective to stabilize the thermoelectric response and the thermal coefficient of resistivity of the devices of the present invention.

BRIEF DESCRIPTION OF THE DRAWING

The sole FIGURE is a schematic representation of a thin film thermocouple according to the invention.

DETAILED DESCRIPTION OF THE INVENTION

Figure 1:
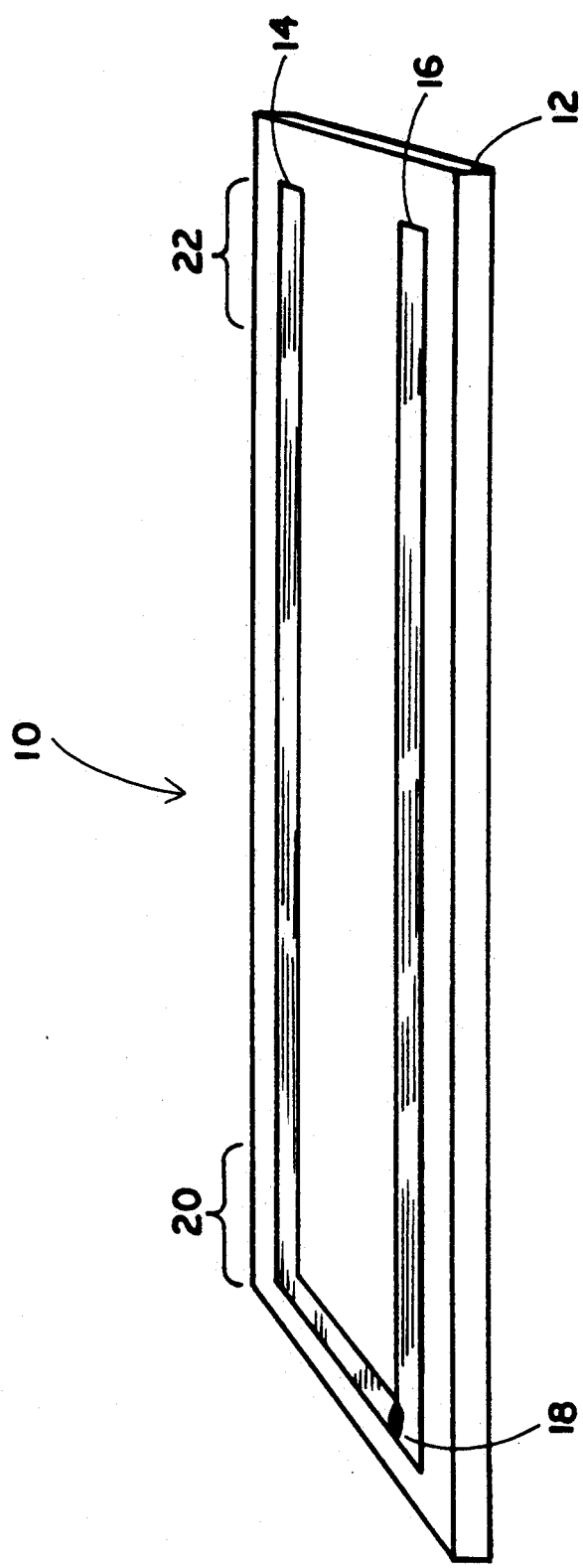

The present invention provides a temperature measuring device in the form of a thermocouple of ruthenium oxide and iridium oxide leads which provides fast response time (up to 1 μsec) which is 100 to 1000 times faster than comparable sheathed sensors.

The device of the invention is more resistant to attack by corrosive environments, such as halide containing acids, cyanides, chlorates or peroxides, than even noble metal thermocouples and far more resistant than base metal thermocouples.

Although iridium oxide is known to have outstanding resistance to corrosion, See, Lauks et al. hereinabove, and Kötz and Stucki hereinabove, refer to the excellent corrosion resistance of RuO$_2$ in their paper for stabilizing RuO$_2$ powdered catalysts by admixtures of IrO$_2$ and the technical applicability of such metal oxide catalysts for the O$_2$ evolving anode in Menbrel ® water electrolysis cells but employing junctions of RuO$_2$ and IrO$_2$ as thermocouples has evaded those knowledgeable in the field of temperature measurement.

In reducing the invention to practice, thermocouples were fabricated by depositing a sputtered film on a substrate of alumina (Al$_2$O$_3$); See, K. Kreider hereinabove. In the sole FIGURE of the drawings, thermocouple 10 includes a substrate 12 on which are formed leg 14, typically of a 1–4 μm thick electrically conducting lead of IrO$_2$ and a similar leg 16 formed of RuO$_2$. A junction of the RuO$_2$ and IrO$_2$ legs 16 and 14 are found at 18. The RuO$_2$ and IrO$_2$ junction 18 creates a temperature measurement area 20 which contacts the environment to be measured. The "cold" or reference junction area is depicted at 22. In use the electrical output of the ruthenium oxide-iridium oxide thermocouple can be used to indicate the temperature of the environment in which the temperature measurement area 20 of thermocouple 10 is immersed. Typically, the sputtered film deposit can be made on any suitable substrate, such as a ceramic or glass substrate (an electrically insulating material), which can also be used as the vessel or container for the chemical process. Thus, the sputtered film can take the form of a probe or a coating for the vessel which contains the corrosive chemical environment.

Typical outputs of the $RuO_2$—$IrO_2$ film thermocouple is 4.5 $\mu V/k$ at 40° C.; 4.3 $\mu V/k$ at 100° C., and 4.1 $\mu V/k$ at 200° C. These values can be adjusted with high temperature (>500° C.) heat treatments of the fabricated thermocouples.

The thin film form of the invention is the most useful form as it permits miniaturization of sensors and electrodes. The thin film form also permits electrode and sensor designs which can incorporate a temperature measuring sensor at the tip of a charge injection electrode or a pH sensor. However, the invention contemplates other applications for ruthenium oxide-iridium oxide thermocouples which include measurement of temperature where the attributes of the invention are employed, i.e., where spatial resolution, fast response and/or corrosion resistance are critical parameters.

It is therefore understood that the foregoing description of the invention in connection with the preferred embodiments are only illustrative of the invention by way of exemplification and not by way of limitation and it is readily within the skill of the ordinary workers skilled in the art to which the invention pertains to modify the same without departing from the features of the invention which are set forth in the appended claims.

I claim:

1. Thermocouples comprising a junction and thin film thermoelements of ruthenium oxide and iridium oxide.

2. The thermocouples of claim 1 having an output of about 4.5 to about 4.1 $\mu V/k$ over the temperature range of about 40° C. to about 200° C.

3. The thermocouples of claim 1 having a response time of up to about 1 $\mu$sec.

4. The thermocouple of claim 1 including a substrate upon which the junction is formed.

5. The thermocouple of claim 4 in which the substrate is selected from the group consisting of glass and ceramics.

6. The thermocouple of claim 1 wherein the junction is in the form of a thin film on a substrate.

7. The thermocouple of claim 6 wherein the substrate comprises a container.

8. The thermocouple of claim 6 wherein the container is used to confine an environment corrosive to the container.

9. A method of sensing the temperature of a corrosive environment comprising contacting the corrosive environment with a thermocouple formed of $RuO_2$—$IrO_2$ and using an electrical output of said thermocouple as an indication of the temperature of the corrosive environment.

10. The method of claim 9 wherein the corrosive environment is selected from the group consisting of halide containing acids, cyanides, chlorates and peroxides.

11. The method of claim 9 wherein the thermocouple is formed on a substrate.

12. The method of claim 9 wherein the substrate is a vessel containing the environment to be sensed.

13. The method of claim 9 wherein the step of contacting also includes the step of sensing the pH of the environment.

14. The method of claim 9 wherein the step of contacting also includes introducing a charge to the environment.

15. The method of claim 9 wherein the electrical output is in the range of about 4.1 $\mu V/k$ to about 4.5 $\mu V/k$.

* * * * *